United States Patent
Cabral, Jr. et al.

(10) Patent No.: US 7,271,455 B2
(45) Date of Patent: *Sep. 18, 2007

(54) FORMATION OF FULLY SILICIDED METAL GATE USING DUAL SELF-ALIGNED SILICIDE PROCESS

(75) Inventors: Cyril Cabral, Jr., Mahopac, NY (US); Chester T. Dziobkowski, Hopewell Junction, NY (US); Sunfei Fang, LaGrangeville, NY (US); Evgeni Gousev, Mahopac, NY (US); Rajarao Jammy, Hopewell Junction, NY (US); Vijay Narayanan, New York, NY (US); Vamsi Paruchuri, New York, NY (US); Ghavam G. Shahidi, Pound Ridge, NY (US); Michelle L. Steen, Danbury, CT (US); Clement H. Wann, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/890,753

(22) Filed: Jul. 14, 2004

(65) Prior Publication Data

US 2006/0022280 A1 Feb. 2, 2006

(51) Int. Cl.
*H01L 21/336* (2006.01)
*H01L 29/76* (2006.01)

(52) U.S. Cl. .............. 257/382; 257/383; 257/384; 257/412; 257/413; 257/347; 257/E21.203; 257/E21.439; 257/E21.636; 257/E21.64; 257/E29.636; 257/E29.266

(58) Field of Classification Search ........ 257/382–384, 257/412–413, 347; 438/300, 585
See application file for complete search history.

(56) References Cited

U.S. PATENT DOCUMENTS

| | | | | |
|---|---|---|---|---|
| 6,737,710 | B2* | 5/2004 | Cheng et al. | 257/382 |
| 6,969,678 | B1* | 11/2005 | Chiu et al. | 438/655 |
| 2004/0026688 | A1* | 2/2004 | Jang et al. | 257/30 |
| 2005/0079695 | A1* | 4/2005 | Carriere et al. | 438/592 |
| 2005/0156238 | A1* | 7/2005 | Wen et al. | 257/347 |
| 2005/0269635 | A1* | 12/2005 | Bojarczuk et al. | 257/338 |
| 2006/0006476 | A1* | 1/2006 | Biery et al. | 257/382 |

FOREIGN PATENT DOCUMENTS

EP 1122771 * 8/2001

* cited by examiner

*Primary Examiner*—A. Sefer
(74) *Attorney, Agent, or Firm*—Scully, Scott, Murphy & Presser, P.C.; Robert M. Trepp, esq.

(57) ABSTRACT

An advanced gate structure that includes a fully silicided metal gate and silicided source and drain regions in which the fully silicided metal gate has a thickness that is greater than the thickness of the silicided source/drain regions is provided. A method of forming the advanced gate structure is also provided in which the silicided source and drain regions are formed prior to formation of the silicided metal gate region.

9 Claims, 8 Drawing Sheets

FORMATION OF FULLY SILICIDED METAL GATE USING DUAL SELF-ALIGNED SILICIDE PROCESS

FIELD OF THE INVENTION

The present invention relates to a semiconductor device and a method of fabricating the same, and more particularly to a metal oxide semiconductor (MOS) device that includes an advanced gate structure, e.g., fully silicided metal gate, as well as a method of fabricating the fully silicided metal gate device.

BACKGROUND OF THE INVENTION

Throughout the prior art, metal gate integration has proven difficult to achieve in a conventional process flow for MOS transistors. Most metal gate materials interact with the gate dielectric during the high temperature processing needed for source/drain (S/D) junction activation anneals. The need to keep the metal gate stack from receiving high temperature anneals has lead to the development of the "gate last" or "replacement gate" process for which the gate stack is fabricated last and remains below 500° C. during subsequent processing. Although the prior art replacement gate process increases the number of material choices for a metal gate, the process complexity and cost increases.

It is known in the prior art to form self-aligned silicided metal gates from a polysilicon gate using the processing steps shown, for example, in FIGS. 1A-1D. Specifically, the prior art process begins with providing the structure shown in FIG. 1A, which structure includes a semiconductor substrate 12, an isolation region 14, gate regions 16L and 16R, a gate dielectric 18, a polySi gate conductor 20 and a cap layer 22. Spacers 24 are located on each gate region as well. As shown, the source/drain implants are performed with the cap layer 22 atop the polySi conductor 20. Next, the cap layer 22 is non-selectively removed, as shown in FIG. 1B, and then a silicide metal 50 such as Ni is deposited on the entire structure providing the structure shown in FIG. 1C. An optional oxygen diffusion barrier layer can be formed atop the silicide metal and then annealing is performed to cause reaction between the polySi and silicide metal. Depending on the metal, a low resistivity silicide can be formed utilizing a single anneal. After the single anneal, any unreacted metal and the optional oxygen diffusion barrier is removed, and if needed, a second anneal may be performed. FIG. 1D shows the structure after the salicide process in which silicided source/drain regions 100 and metal silicide gate 102 are formed. In this prior art process, gate and source/drain silicidation occurs simultaneously.

As shown, this prior art process forms thick metal silicide gates and thick source/drain silicides, each having a thickness of approximately 100 nm. The prior art structure is clearly depicted in the SEM micrograph shown in FIG. 2. Such a thick source/drain silicide can be problematic given the recess of the isolation regions of the device caused by the non-selective removal of the cap layer from the gate. Specifically, the silicide in this prior art process can contact the implanted well regions of the device thereby shorting the device. Moreover, the thick silicide may consume the silicon in the extension regions under the spacers leading to poor device performance. Hence, a method that produces a thick and fully silicided metal gate and a much thinner source/drain silicide is needed.

SUMMARY OF THE INVENTION

The present invention relates to an advanced gate structure that includes a fully silicided metal gate and silicided source and drain regions that abut the silicided metal gate. Specifically, and in broad terms, the present invention provides a semiconductor structure that comprises a fully silicided metal gate of a first silicide metal having a first thickness and abutting silicided source and drain regions of a second metal having a second thickness, wherein said second thickness is less than the first thickness and said silicided source and drain regions contain a surface layer of said first silicide metal.

The surface layer of the first silicide metal located on the silicided source and drain regions has a thickness of less than 10 nm. The surface layer of first silicided metal has a concentration of first silicide metal that is less than about 25 atomic %. The concentration of first silicide metal on said silicided source and drain regions is measured by Auger Spectroscopy or another like surface analysis technique.

In accordance with the present invention, the thick fully silicided metal gate and the thinner silicided source and drain regions can be composed of the same or different metal silicide such as, for example, silicides of Ti, Ta, W, Co, Ni, Pt, Pd and alloys thereof. Of the various silicides, silicides of Co, Ni or Pt, in their lowest resistivty phase, are particularly preferred. In a highly preferred embodiment of the present invention, the source and drain regions include $CoSi_2$, while the silicided metal gate includes NiSi or NiPtSi.

In another aspect of the present invention, a metal oxide semiconductor (MOS) device is provided that comprises a semiconductor substrate having silicided source and drain regions located on a surface thereof, said source and drain regions having a thickness of less than 500 Å and being self-aligned to a gate region that includes a fully silicided metal gate having a thickness of greater than 500 Å.

In addition to the structure described above, the present invention also provides a method for forming the advanced gate structure having a thick and fully silicided metal gate and the thinner silicided source and drain regions abutting the silicided metal gate. In broad terms, the method of the present invention comprises the steps of:

providing a structure comprising at least one patterned gate stack and abutting silicided source and drain regions, said at least one patterned gate stack including a polysilicon gate conductor and an overlying dielectric cap;

removing the overlying dielectric cap to expose the polysilicon gate conductor; and converting the polysilicon gate conductor into a fully silicided metal gate, wherein said fully silicided metal gate has a thickness that is greater than the silicided source and drain regions.

DETAILED DESCRIPTION OF THE INVENTION

Figures 1A, 1B:
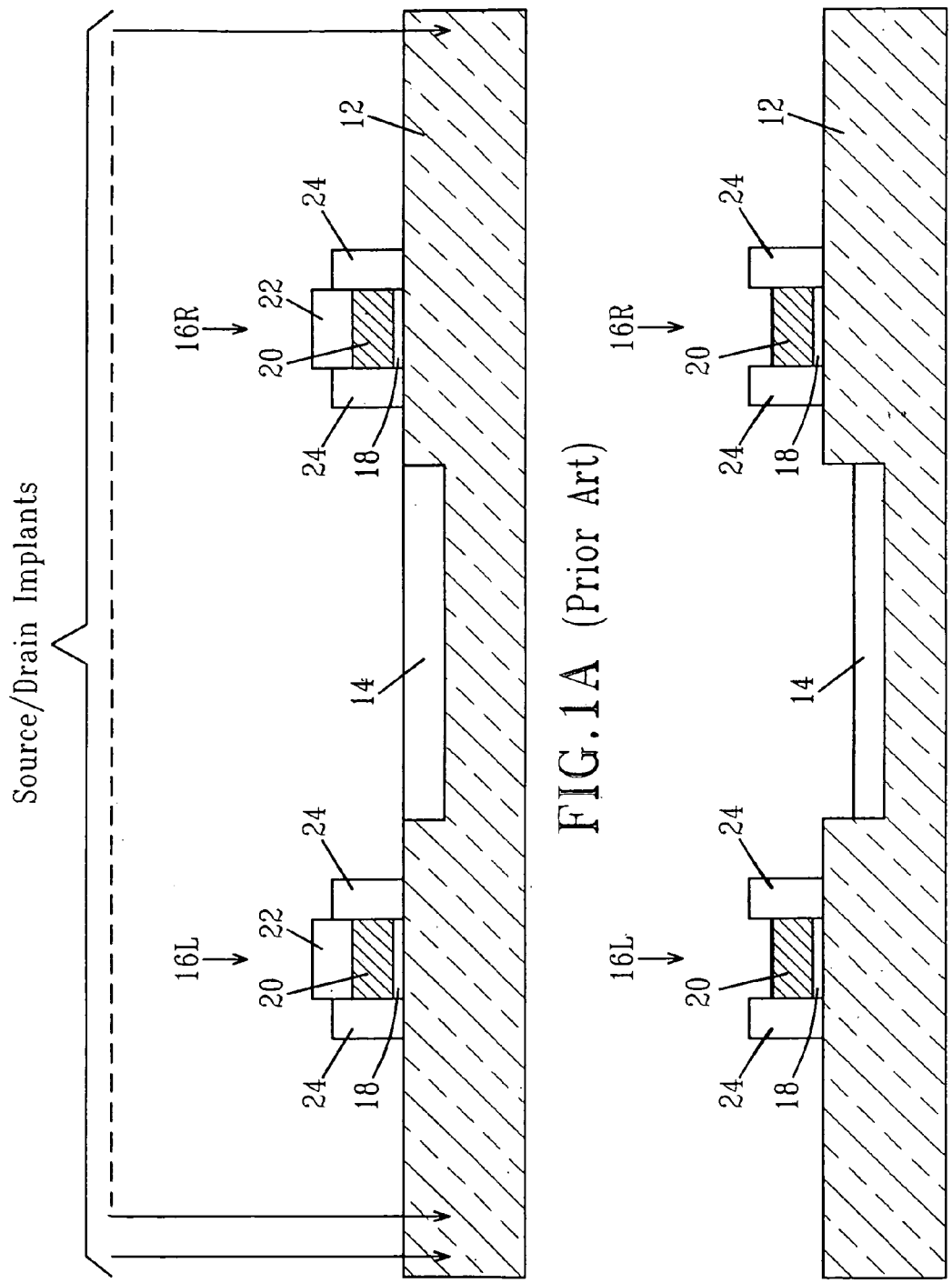
FIGS. 1A-1D are pictorial representations (through cross sectional views) illustrating prior art processing steps for fabricating a MOS device having silicided metal gates and silicided source and drain regions in which the silicided metal gate and the silicided source and drain regions have approximately the same thickness.
Figure 1C:
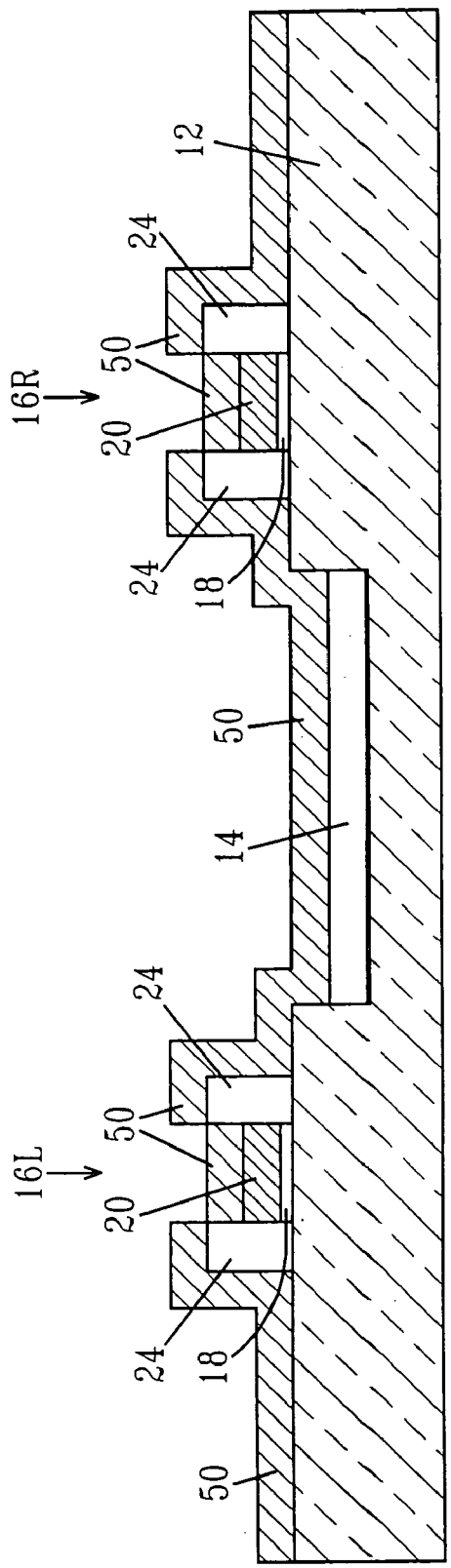
Figure 1D:
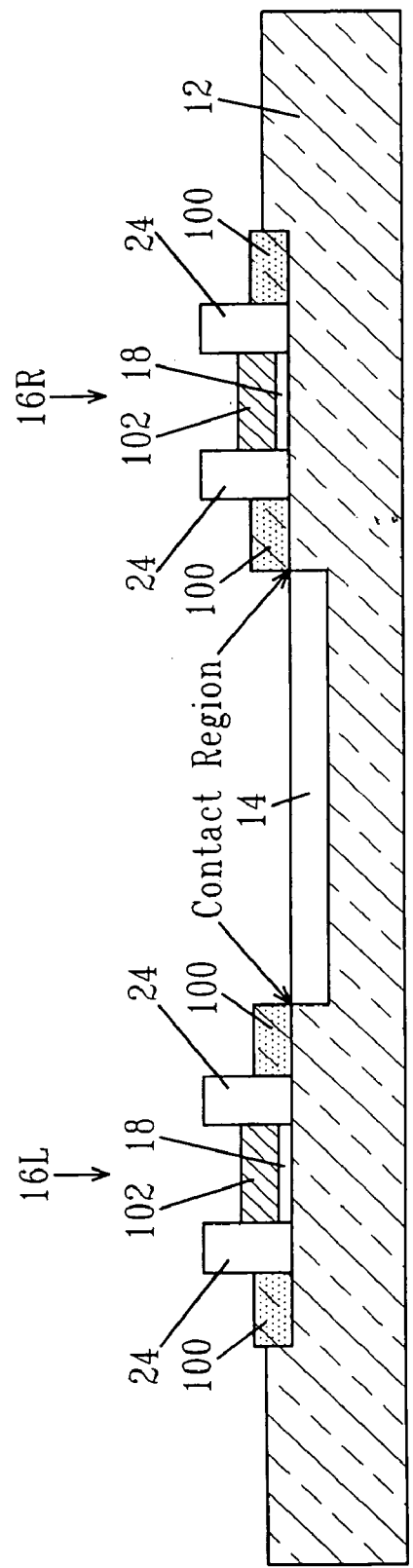
Figure 2:
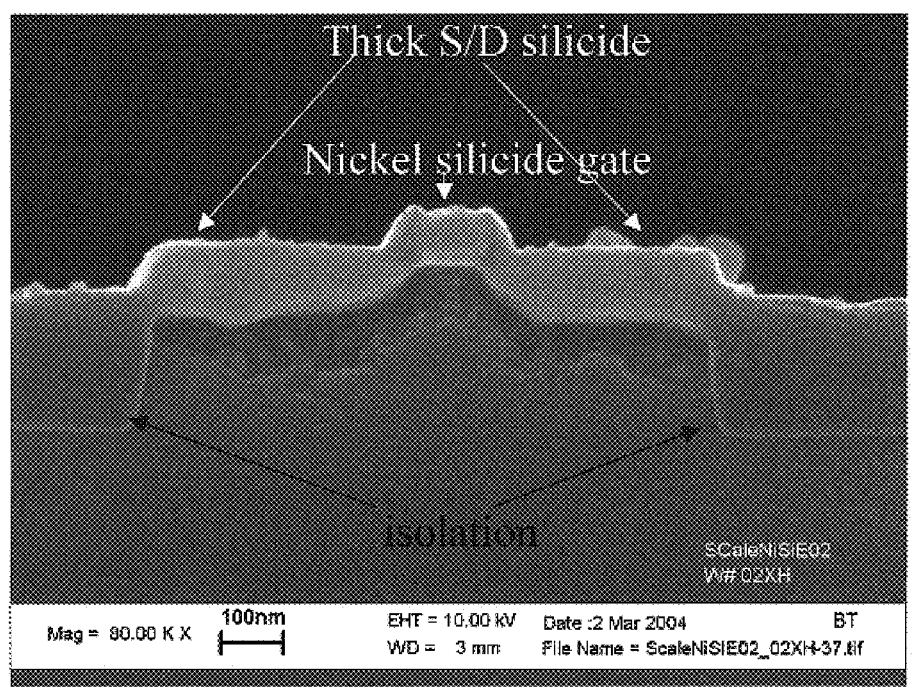
FIG. 2 is an actual SEM micrograph showing a prior art MOS device that has a nickel silicide gate and nickel silicide source/drain regions, each of which has approximately the same thickness of about 100 nm.

The present invention, which provides a MOS device that has a fully silicided gate and thin silicided source and drain regions (relative to the gate and prior art silicided source/drain regions) as well as a method of fabricating the same, will now be described in greater detail by referring to FIGS. 3A-3E which accompany the present application. In the accompanying drawings, which are not drawn to scale, like and/or corresponding elements are referred to by like reference numerals. It is noted that in the drawings two MOS device regions are shown to be formed atop a single semiconductor substrate. Although illustration is made to such an embodiment, the present invention is not limited to the formation of any specific number of MOS devices on the surface of the semiconductor structure. Instead, the method of the present invention forms at least one fully silicided MOS device on a surface of a semiconductor substrate.

Figure 3A:
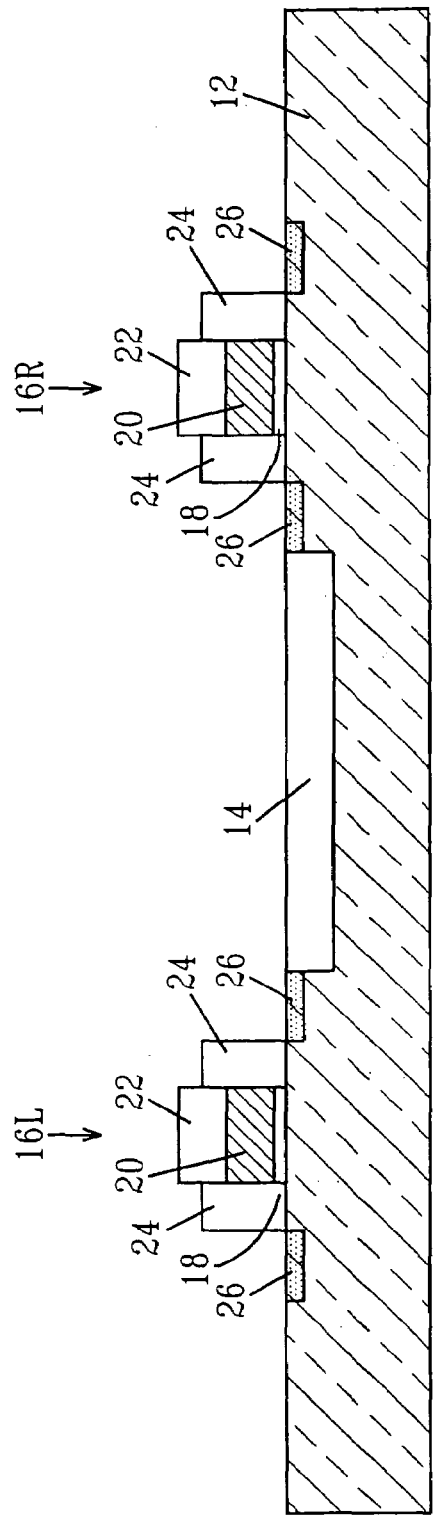
FIGS. 3A-3E are pictorial representations (through cross sectional views) illustrating the inventive processing steps for fabricating a MOS device having fully silicided metal gates and silicided source and drain regions in which the silicided source and drain regions are thinner than the fully silicided metal gates as well as prior art silicided source and drain regions.

Reference is first made to structure 10 that is illustrated in FIG. 3A. Structure 10 includes a semiconductor substrate 12 having an isolation region 14 located therein. Structure 10 also includes two gate regions 16L and 16R, which are located on a surface of the semiconductor substrate 12, yet separated from each other by isolation region 14. Each gate region, i.e., 16R and 16L, includes a gate dielectric 18, a polySi conductor 20, a dielectric cap 22, spacers 24 and silicided source/drain regions 26.

The semiconductor substrate 12 of structure 10 comprises any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

At least one isolation region 14 is then typically formed into the semiconductor substrate 12. The isolation region 14 may be a trench isolation region, as shown, or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region 14 provides isolation between neighboring gate regions. The neighboring gate regions can have the same conductivity (i.e., both n- or p-type), or alternatively they can have different conductivities (i.e., one n-type and the other p-type).

After forming the at least one isolation region 14 within the semiconductor substrate 12, gate dielectric 18 is formed on the entire surface of the structure including the semiconductor substrate 12 and atop the isolation region 14, if it is a deposited dielectric. The gate dielectric 18 can be formed by a thermal growing process-such as, for example, oxidation, nitridation or oxynitridation. Alternatively, the gate dielectric 18 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 18 may also be formed utilizing any combination of the above processes.

The gate dielectric 18 is comprised of an insulating material including, but not limited to: an oxide, nitride, oxynitride and/or silicate including metal silicates and nitrided metal silicates. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 18 may vary, but typically, the gate dielectric 18 has a thickness from about 0.5 to about 10 nm, with a thickness from about 0.5 to about 3 nm being more typical.

After forming the gate dielectric 18, a blanket layer of polysilicon (i.e., polySi) which becomes the polySi conductor 20 shown in FIG. 3A is formed on the gate dielectric 18 utilizing a known deposition process such as, for example, physical vapor deposition, CVD or evaporation. The blanket layer of polysilicon may be doped or undoped. If doped, an in-situ doping deposition process may be employed in forming the same. Alternatively, a doped polySi layer can be formed by deposition, ion implantation and annealing. The doping of the polySi layer will shift the workfunction of the silicided metal gate formed. Illustrative examples of dopant ions include As, P, B, Sb, Bi, In, Al, Ga, Tl or mixtures thereof. Preferable doses for the ion implants are 1E14 ($=1 \times 10^{14}$) to 1E16 ($=1 \times 10^{16}$) atoms/cm$^2$ or more preferably 1E15 to 5E15 atoms/cm$^2$. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

After deposition of the blanket layer of polysilicon, a dielectric cap layer 22 is formed atop the blanket layer of polysilicon 20 utilizing a deposition process such as, for example, physical vapor deposition or chemical vapor deposition. The dielectric cap layer 22 may be an oxide, nitride, oxynitride or any combination thereof. In one embodiment, a nitride such as, for example, $Si_3N_4$, is employed as the dielectric cap layer. In yet another embodiment, the dielectric cap layer 22 is an oxide such as $SiO_2$. The thickness, i.e., height, of the dielectric cap layer 22 is from about 20 to about 180 nm, with a thickness from about 30 to about 140 nm being more typical.

In one embodiment, the blanket layer of polysilicon 20 and dielectric cap layer 22 have a total height that ranges from about 50 to about 180 nm. In yet another embodiment, the height of the blanket polysilicon layer and the dielectric cap layer is about 120 nm; typically 70 nm polySi and 50 nm dielectric cap.

The blanket polysilicon layer and dielectric cap layer are then patterned by lithography and etching so as to provide patterned gate stacks. The patterned gate stacks may have the same dimension, i.e., length, or they can have variable dimensions to improve device performance. Each patterned gate stack at this point of the present invention includes a polySi gate 20 and dielectric cap 22. The lithography step includes applying a photoresist to the upper surface of the dielectric cap layer, exposing the photoresist to a desired pattern of radiation and developing the exposed photoresist utilizing a conventional resist developer. The pattern in the photoresist is then transferred to the dielectric cap layer and the blanket layer of polysilicon utilizing one or more dry etching steps. In some embodiments, the patterned photoresist may be removed after the pattern has been transferred into the dielectric cap layer. In other embodiments, the patterned photoresist is removed after etching has been completed.

Suitable dry etching processes that can be used in the present invention in forming the patterned gate stacks include, but are not limited to: reactive ion etching, ion beam etching, plasma etching or laser ablation. The dry etching process employed is typically selective to the underlying gate dielectric 18 therefore this etching step does not typically remove the gate dielectric. In some embodiments, this etching step may however be used to remove portions of the gate dielectric 18 that are not protected by the gate stacks.

Next, at least one spacer 24 is formed on exposed sidewalls of each patterned gate stack. The at least one spacer 24 is comprised of an insulator such as an oxide, nitride, oxynitride and/or any combination thereof. The at least one spacer is formed by deposition and etching.

The width of the at least one spacer 24 must be sufficiently wide enough such that the source and drain silicide contacts (to be subsequently formed) do not encroach underneath the edges of the gate stack. Typically, the source/drain silicide does not encroach underneath the edges of the gate stack when the at least one spacer has a width, as measured at the bottom, from about 15 to about 80 nm.

After spacer formation, source/drain diffusion regions (not specifically shown) are formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art.

Next, and if not previously removed, the exposed portion of the gate dielectric 18 is removed utilizing a chemical etching process that selectively removes the gate dielectric 18. This etching step stops on an upper surface of the semiconductor substrate 12 as well as an upper surface of the isolation regions 14. Although any chemical etchant may be used in removing the exposed portions of the gate dielectric 18, in one embodiment dilute hydrofluoric acid (DHF) is used.

Source and drain silicide contacts 26 (hereinafter source/drain silicides) are then formed using a salicide process which includes the steps of depositing a silicide metal on an exposed surface of the substrate 12 that includes the source/drain diffusion regions, optionally depositing an oxygen diffusion barrier material such as TiN on the silicide metal, first annealing to form a silicide, selective etching any non-reacted metal including barrier material if used and, if needed, performing a second annealing step.

When the semiconductor substrate does not comprise silicon, a layer of silicon (not shown) can be grown atop the exposed surface of the semiconductor substrate 12 and can be used in forming the source/drain silicide contacts.

The silicide metal used in forming the source/drain silicides 26 comprises any metal that is capable of reacting with silicon to form a metal silicide. Examples of such metals include, but are not limited to: Ti, Ta, W, Co, Ni, Pt, Pd and alloys thereof. In one embodiment, Co is a preferred metal. In such an embodiment, the second annealing step is required. In another embodiment, Ni or Pt is preferred. In this embodiment, the second annealing step is typically not performed.

The metal used in forming the source/drain silicides 26 may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The salicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step.

The source/drain silicides, i.e., silicided source/drain regions, 26, which are formed utilizing the above-mentioned process, are self-aligned to the gate region 16R or 16L. Moreover, the silicided source/drain regions 26 have a thickness (measured vertically) of less than 500 Å, with a thickness from about 150 to about 300 Å being more typical. Note that 10 Å=1 nm.

Figure 3B:
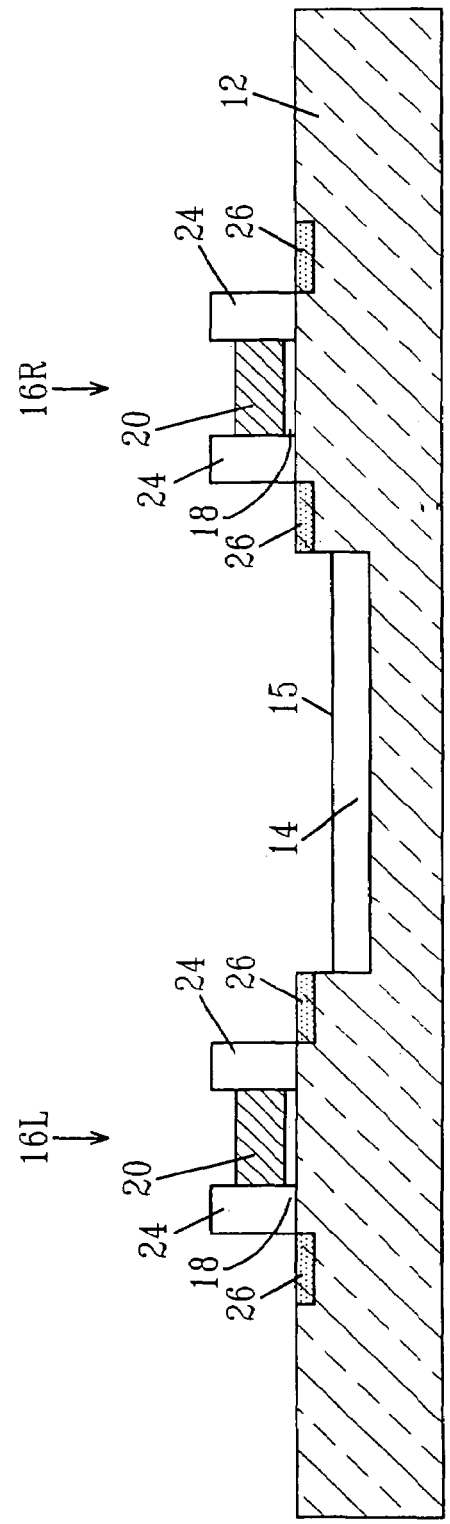
Figure 3C:
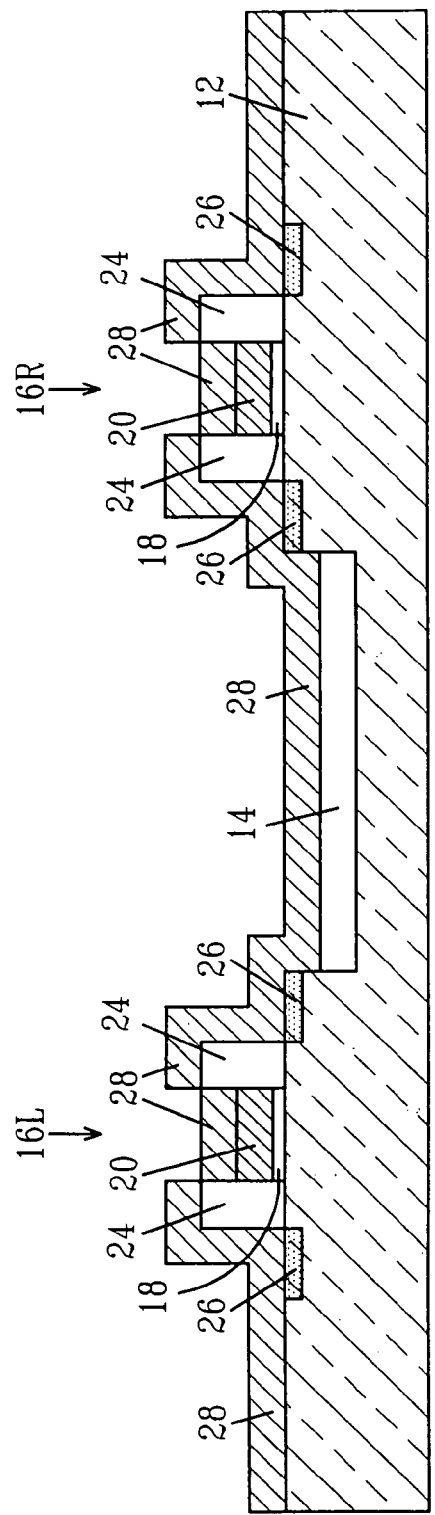

Next, and as shown in FIG. 3B, the dielectric cap layer 22 is removed from each gate region 16L and 16R so that the underlying polysilicon gate conductor 20 is exposed. During the removal of the dielectric cap 22 from atop the polysilicon gate conductor 20, a surface portion of the isolation region 14 may also be removed so as to provide an isolation region 14 having a recessed surface. The recessed surface is labeled as 15 in FIG. 3B. The amount of recessing is not critical to the present invention, but typically, the at least one isolation region 14 can be recessed from about 100 to about 500 Å below the upper surface of the semiconductor substrate 12 during this step of the present invention.

The dielectric cap 22 is removed in the present invention by utilizing an etching process, wet or dry, which selectively removes the dielectric cap material from the structure. Although a dry etching process such as reactive-ion etching (RIE), ion beam etching (IBE), and plasma etching can be employed, it is preferred that a wet etch process be employed in selectively removing the dielectric cap 22 without removing much of the silicided source/drain regions 26. An example of a wet etch process that can be used to selectively remove the dielectric cap 22 includes dilute hydrofluoric acid (DHF) mixed with at least one additive which selectively adsorbs at the silicided source/drain regions 26, but not at the dielectric cap 22. This selective adsorption of the additives is achieved by exploiting the difference in the electro-kinetic behavior of the silicided source/drain regions 26 and the dielectric cap 22 in the DHF solution. As the additives form a very thin adsorbed layer (~2-5 nm) at the surface of silicided source/drain regions 26, that region would experience almost negligible etch rate, whereas the dielectric surface 22 will be etched at rates similar to DHF only solutions. Also, instead of mixing the additives to the DHF solution, the same effect may also be realized by exposing the surfaces to an aqueous or inaqeous solutions with the above said additives and then etching in DHF solution. Examples of additive that can be employed during the selective etching process include, but are not limited to: any organic and inorganic compounds that would selectively adsorb at the silicided surfaces 26 and not the dielectric cap 22, in general, and all amphoteric molecules such as surfactants and polymers in specific.

In some embodiments of the present invention, a protective cap layer such as, for example, a silicon oxynitride layer (i.e., $SiO_xN_y$) can be formed over the silicided source/drain regions 26. This step typically is performed prior to removing the dielectric cap 22. The protective cap is used in the present invention to ensure that the silicided source/drain regions 26 do not undergo further silicidation with the silicide metal used in forming the silicided gate. The protective cap can be formed, for example, by subjecting the $SiO_2$ layer atop the silicided source/drain regions 26 to a plasma of nitrogen. In addition to plasma nitrogen treatment, the silicided source/drain regions 26 can be modified using other wet or dry chemistries that are capable of forming a protective cap thereon. The protective cap can also be formed by ion implantation of a species that can slow down, i.e., substantially hinder, silicide metal 28 diffusion. Nitrogen is one example of a species that can be ion implanted. Another method of forming the protective cap is by depositing a silicide metal alloy atop the silicided source/drain regions 26 which will introduce an impurity to slow down silicide metal 28 diffusion. The silicide metal alloy is defined hereinbelow. If present, the protective cap is a thin layer whose thickness is typically from about 0.5 to about 3 nm.

After etching the cap dielectric 22 from atop the polySi gate conductor 20, a second salicide process is then performed to consume the polySi conductor 20 forming fully silicided metal gates. The second salicide process is exemplified in FIGS. 3C and 3D. The first step of the second salicide process includes depositing a blanket silicide metal 28 atop the structure shown in FIG. 3B. The resultant structure including the blanket silicide metal 28 is shown, for example, in FIG. 3C. The silicide metal 28 can be deposited using one of the deposition processes mentioned above in forming the metal used in source/drain silicide contact formation. The silicide metal 28 can be the same or different than the metal used in forming the silicided source/drain regions 26.

The silicide metal 28 can be composed of Ti, Hf, Ta, W, Co, Ni, Pt, Pd or alloys thereof. In one embodiment, the silicide metal 28 is Co; $CoSi_2$ forms using a two step annealing process. In another embodiment of the present invention, the silicide metal 28 is Ni or Pt; NiSi and PtSi form using a single annealing step.

The silicide metal 28 thickness is selected so as to form the silicide phase with the appropriate workfunction for the particular MOS device and to consume all of the polySi conductor 20. For example, NiSi has a workfunction of 4.65 eV, and if the initial polysilicon height is 50 nm, the amount of Ni needed is about 27 nm. $CoSi_2$ has a workfunction of 4.45 eV, and if the initial polysilicon height is 50 nm, the amount of Co needed is about 14 nm. Although the silicide metal thicknesses given are the amount necessary to just consume the polysilicon, it is preferred if the thickness were in excess by about 10% to make sure consumption is complete.

In some embodiments (not shown), an oxygen diffusion barrier such as TiN or W is formed atop the silicide metal 28.

After deposition of the silicide metal 28, a first anneal is employed to form a first silicide phase in the structure; the first silicide phase may or may not represent the lowest resistivity phase of a metal silicide. The first anneal is performed utilizing the ambients and temperatures described above in forming the source/drain silicide contacts 26. Next, a selective wet etch step is employed to remove any non-reactive silicide metal from the structure.

For some metal silicides, the salicide process may be stopped at this point since the polysilicon is consumed and the resistivity of the first silicide phase is close to minimum values for the phase. This is in the case for Ni and Pt. In other cases, for example when Co or Ti are used as the silicide metal, a second higher temperature anneal (as described above) is needed for the consumption of the remaining polysilicon and forming a second silicide phase material. In this embodiment, the first silicide phase is a high resistivity phase silicide material, while the second silicide phase material is a lower resistivity phase silicide material.

Figure 3D:
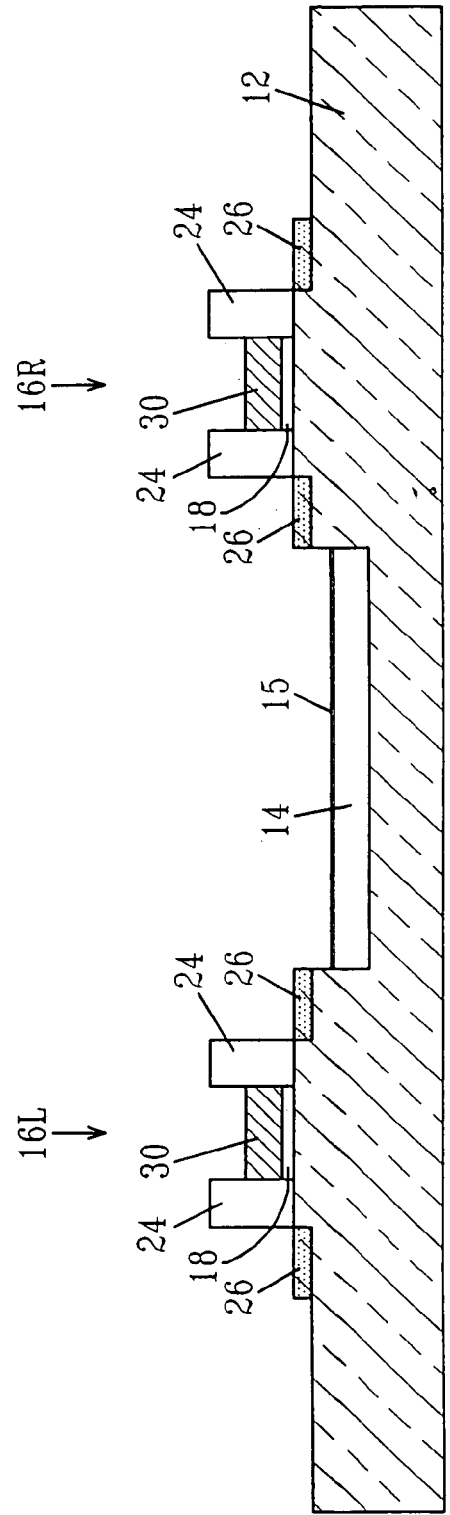
Figure 3E:
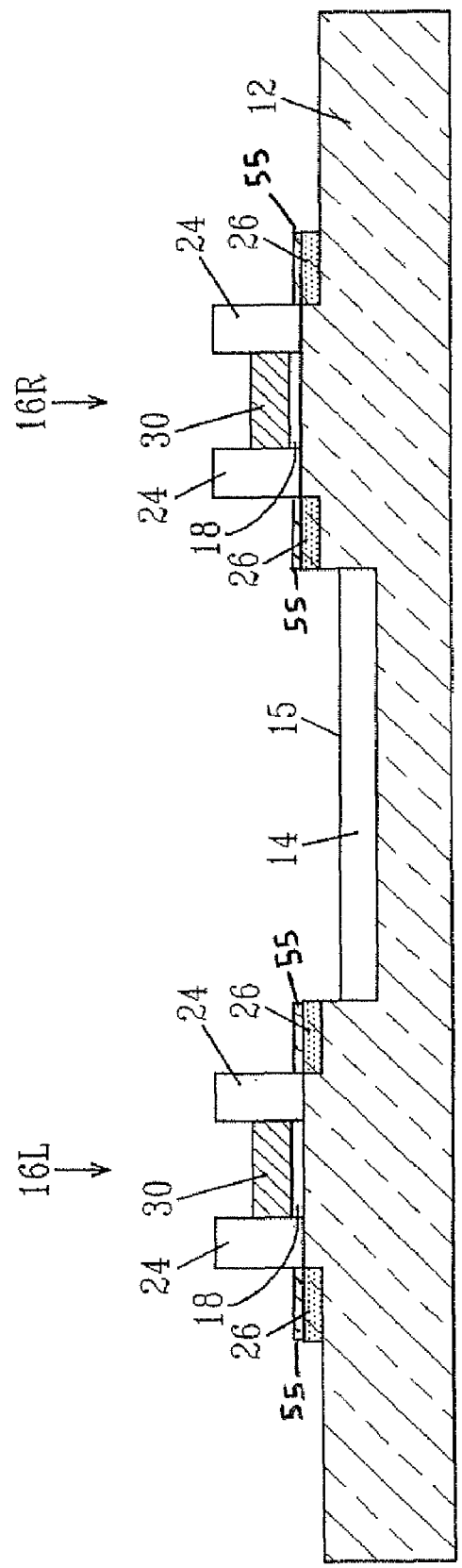

FIG. 3D shows the structure after formation of fully silicided metal gates 30. The fully silicided metal gates 30 are located atop the gate dielectric 18 between spacers 24 in an area previously occupied by the polySi conductor 20.

As shown, the fully silicided metal gate 30 is thicker than the corresponding silicided source/drain regions 26. Typically, the silicided source/drain regions 26 have a thickness that is less than 500 Å, while the silicided metal gate 30 has a thickness that is greater than 500 Å. In a preferred embodiment, the silicided source/drain regions 26 typically have a thickness that is less than 300 Å, while the silicided metal gate 30 has a thickness that is greater than 500 Å. In yet another preferred embodiment, the silicided source/drain regions 26 typically have a thickness that is less than 200 Å, while the silicided metal gate 30 has a thickness that is greater than 500 Å.

In one preferred embodiment, the silicided source/drain regions comprise $CoSi_2$ and the silicided metal gates comprise NiSi or NiPtSi.

After completion of the inventive metal silicide gate processing mentioned above, the conventional approach for building a multilayer interconnect structure for transistor to transistor and transistor to external contacts can be employed.

In the process of the present invention, the silicided metal used in forming the silicided source/drain regions and the silicided metal gate may include an alloying additive that can enhance the formation of the metal silicide. Examples of alloying additives that can be employed in the present invention include, but are not limited to: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the material used in forming the silicide. When present, the alloying additive is present in an amount from about 0.1 to about 50 atomic percent. The alloying additive may be introduced as a dopant material to the silicide metal layer or it can be a layer that is formed atop the silicide metal layer prior to annealing.

It should be noted that although the above describes an initial structure that does not include raised source/drain regions, the present invention also contemplates the presence of raised source/drain regions in the initial structure. The raised source/drain regions are formed utilizing conventional techniques well known to those skilled in the art. Specifically, the raised source/drain regions are formed by depositing any Si-containing layer, such as epi Si, amorphous Si, SiGe, and the like, atop the substrate 12 prior to implanting.

As stated above the present invention provides a semiconductor structure comprising a thick, fully silicided metal gate and a thin, silicided source/drain regions abutting the metal gate. In some embodiments of the present invention (See FIG. 3E), the semiconductor structure is characterized as having a silicide metal surface layer (e.g., a metal that is capable of forming a silicide when reacted with a semiconductor) 55 atop the silicided source/drain regions that includes a small amount (less than about 25 atomic %) of metal used in making the fully silicided gate, which does not form a further silicide atop the silicided source/drain regions. The silicide metal surface layer 55 atop the source/drain region has a thickness of about 10 nm or less. Thus, for example, it is possible to form a structure having a fully silicided NiSi gate and contacts atop the source/drain regions that comprise $CoSi_2$ with Ni as a surface layer.

The following example illustrates the method of the present invention which is employed in forming a fully silicided metal gate having a first thickness and abutting metal silicided source/drain regions having a second thickness, wherein the second thickness is less than the first thickness.

EXAMPLE

In this example, $CoSi_2$ contacts are formed using a salicide process on the S/D regions of the device with a capping layer on a polycrystalline silicon gate. The salicide process entailed a DHF clean of the S/D Si surface, blanket Co metal deposition with a TiN diffusion barrier layer, a rapid thermal anneal (RTA) in the temperature range of 500° to 600° C. was employed to form CoSi, a selective etch in $H_2O_2:H_2SO_4$ was performed to remove unreacted Co and the TiN cap layer, and a second RTA anneal in the temperature range 650° to 750° C. was performed to form $CoSi_2$.

After formation of S/D $CoSi_2$, the capping layer was removed from the gate and a nickel salicide process is employed to from the fully silicided metal gates. Specifically, after mask removal of the capping layer, a blanket Ni metal layer with a TiN diffusion barrier layer was deposited, a rapid thermal anneal in the temperature range of 400° to 500° C. was employed to form NiSi and a selective etch in $H_2O_2:H_2SO_4$ was used to remove the unreacted Ni and the TiN layer.

The table below shows data from experiments that were performed to determine the maximum temperature at which a blanket Ni layer on $CoSi_2$ can be annealed before NiSi formation starts to occur. A 17 nm TiN/25 nm Ni bilayer was deposited on 25 nm of $CoSi_2$ after the surface of the $CoSi_2$ was cleaned with a DHF etch at 100:1 for 2 min. The film stack was then annealed at temperatures ranging from 400° to 550° C. in $N_2$ for 30 s and sheet resistance measured, after removal of the TiN cap and any unreacted Ni, to determine if NiSi was formed. If NiSi is formed, a decrease in sheet resistance is expected since the metal stack thickness will increase. From the table, NiSi starts to form at temperatures above 450° C. Hence, there is a range of temperatures for which one can form NiSi metal gates (<450° C.) without forming NiSi on the $CoSi_2$ S/D contacts.

| Sample | Sheet Resistance (Ohm/square) |
| --- | --- |
| As Deposited | 8.56 |
| Anneal 400° C./30 s in $N_2$ | 8.87 |
| Anneal 450° C./30 s in $N_2$ | 9.62 |
| Anneal 500° C./30 s in $N_2$ | 7.63 |
| Anneal 550° C./30 s in $N_2$ | 2.81 |

Figure 4A:
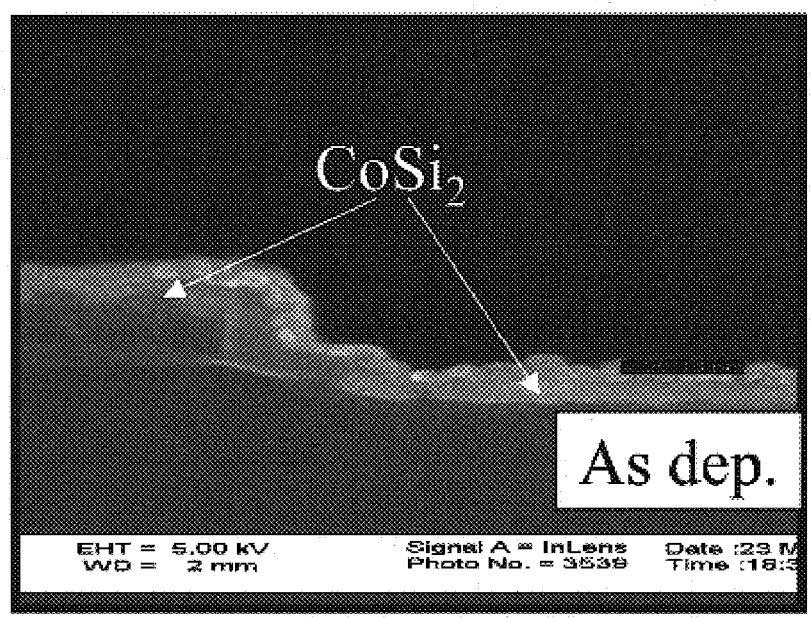
FIGS. 4A-4D are actual SEM micrographs of the MOS devices formed using the conditions described in the table of the sole Example.
Figure 4B:
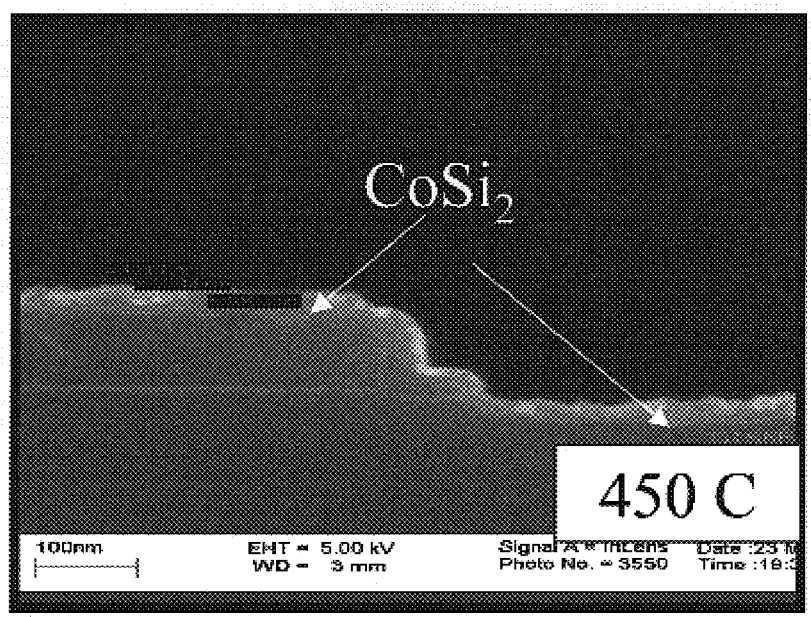
Figure 4C:
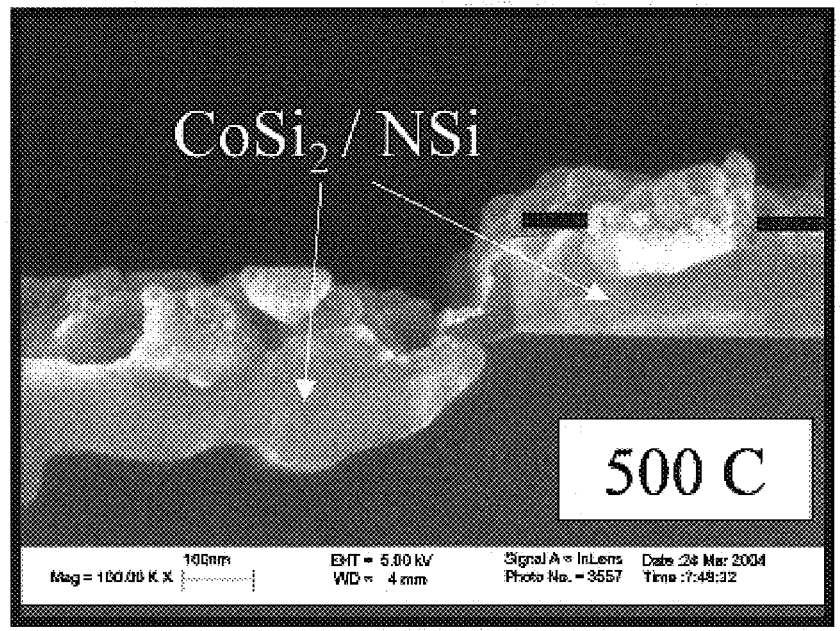
Figure 4D:
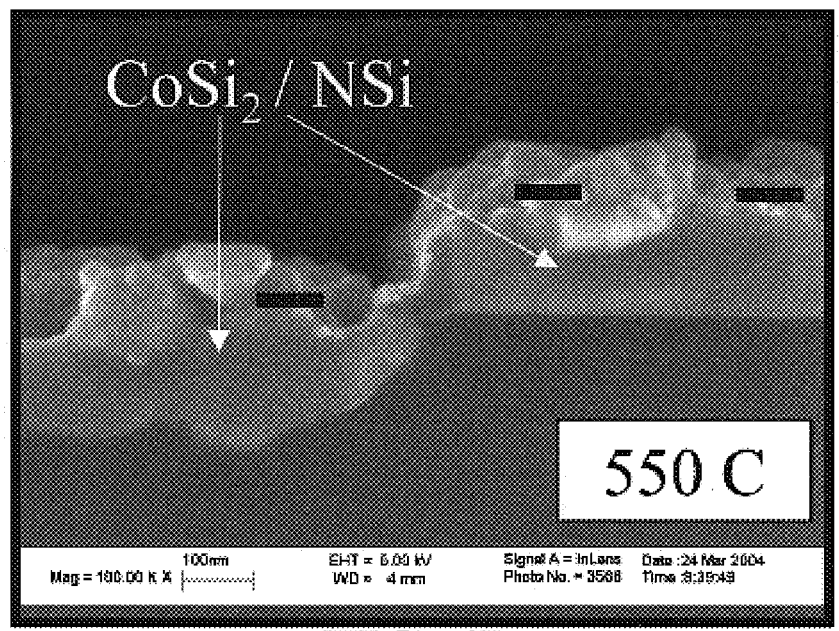

FIGS. 4A-4D show the actual SEM micrographs for the samples described in the above table. FIG. 4A depicts the as deposited sample where $CoSi_2$ has been formed on the S/D and gate of the device. The $CoSi_2$ thickness is approximately 300 Å. FIGS. 4B-4D depict the devices after the Ni salicide process has been completed on those samples similar to FIG. 4A. The temperature used for the anneal step in the process was varied as shown in the table above. The thickness of the silicide formed correlates with the sheet resistance in the table. Namely, for anneals at 500° C. and above, additional silicide (NiSi) has formed through the $CoSi_2$ layer.

An approach to enlarge the above mentioned widow entails modifying the $CoSi_2$ surface with either a wet or dry chemistry. As an example $CoSi_2$ has a thin $SiO_2$ layer on its surface which can be modified to form a $SiO_xN_y$ layer by introducing the film to a $N_2$ plasma. This $SiO_xN_y$ layer would be a better barrier layer to NiSi formation compared to the $SiO_2$ layer. This will cause an increase in the range of anneal temperatures for Ni silicide. Similar chemical changes to the surface of $CoSi_2$ may be achieved with wet solutions. This can enable a higher temperature, 550° C. anneal, and NiPtSi formation.

The present invention provides a method to produce fully silicided metal gates with thin source/drain silicides and is an improvement from the process described above in terms of number of critical steps (oxide CMP) reducing cost and complexity.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim as new is:

1. A semiconductor structure comprising a fully silicided metal gate of NiSi or NiPtSi having a first thickness and abutting silicided source and drain regions of $CoSi_2$ having a second thickness, wherein said second thickness is less than the first thickness and said silicided source and drain regions contain a surface layer comprising Ni located directly on an upper surface of said $CoSi_2$, and wherein no NiSi is located on said silicided source and drain regions.

2. The semiconductor structure of claim 1 wherein said first thickness is greater than 500 Å and said second thickness is less than 500 Å.

3. The semiconductor structure of claim 1 wherein said first thickness is greater than 500 Å and said second thickness is less than 300 Å.

4. The semiconductor structure of claim 1 wherein said first thickness is greater than 500 Å and said second thickness is less than 200 Å.

5. The semiconductor structure of claim 1 wherein said silicided metal gate is located atop a semiconductor substrate, said silicided metal gate further comprising at least one spacer and an underlying gate dielectric.

6. A metal oxide semiconductor (MOS) device comprising a semiconductor substrate having silicided source and drain regions located on a surface thereof said source and drain regions comprising $CoSi_2$ and having a thickness of less than 500 Å, being self-aligned to a gate region that includes a fully silicided metal gate comprising NiSi or NiPtSi and having a thickness of greater than 500 Å, wherein said source and drain regions comprise a surface layer that comprises Ni located directly on an upper surface of said $CoSi_2$, and wherein no NiSi is located on said source and drain regions.

7. The metal MOS device of claim 6 wherein said thickness of said silicided source and drain regions is less than 300 Å.

8. The metal MOS device of claim 6 wherein said thickness of said silicided source and drain regions is less than 200 Å.

9. The metal MOS device of claim 6 wherein said silicided metal gate is located atop a semiconductor substrate, said silicided metal gate further comprising at least one spacer and an underlying gate dielectric.

* * * * *